(12) United States Patent
Beltran Albarran et al.

(10) Patent No.: US 9,359,776 B2
(45) Date of Patent: Jun. 7, 2016

(54) WALKABLE PHOTOVOLTAIC FLOOR

(71) Applicant: Onyx Solar Energy S.L., Avila (ES)

(72) Inventors: Alvaro Felix Beltran Albarran, Avila (ES); Teodosio Del Cano Gonzalez, Avila (ES); Daniel Valencia Caballero, Avila (ES); Jose Maria Jimenez Lopez, Avila (ES); Leonardo Casado Delgado, Avila (ES)

(73) Assignee: ONYX SOLAR ENERGY S.L., Avila (ES)

( * ) Notice: Subject to any disclaimer, the term of this patent is extended or adjusted under 35 U.S.C. 154(b) by 0 days.

(21) Appl. No.: 14/407,369

(22) PCT Filed: Apr. 25, 2013

(86) PCT No.: PCT/ES2013/070266
§ 371 (c)(1),
(2) Date: Dec. 11, 2014

(87) PCT Pub. No.: WO2013/186412
PCT Pub. Date: Dec. 19, 2013

(65) Prior Publication Data
US 2015/0121780 A1  May 7, 2015

(30) Foreign Application Priority Data
Jun. 14, 2012 (ES) .................... 201230932

(51) Int. Cl.
| | | |
|---|---|---|
| *E04D 13/18* | (2014.01) | |
| *E04F 15/10* | (2006.01) | |
| *H01L 31/048* | (2014.01) | |
| *E04F 15/08* | (2006.01) | |
| *H02S 20/26* | (2014.01) | |
| *E04B 5/46* | (2006.01) | |
| *E04F 15/02* | (2006.01) | |

(52) U.S. Cl.
CPC ............. *E04F 15/107* (2013.01); *E04B 5/46* (2013.01); *E04F 15/02172* (2013.01); *E04F 15/082* (2013.01); *H01L 31/048* (2013.01); *H02S 20/26* (2014.12); *E04F 2290/00* (2013.01); *E04F 2290/026* (2013.01); *Y02B 10/10* (2013.01); *Y02E 10/50* (2013.01)

(58) Field of Classification Search
CPC ..... E04F 15/107; E04F 15/02172; E04F 5/46; E04F 15/082; E04F 2290/00; E04F 2290/026; E04B 5/46; H02S 20/26; H01L 31/048; Y02B 10/10; Y02E 10/50
USPC .................................. 52/173.3, 177
See application file for complete search history.

(56) References Cited

U.S. PATENT DOCUMENTS 5,441,827 A * 8/1995 Gratzel et al. ............. 429/111
5,478,402 A * 12/1995 Hanoka .................... 136/251
(Continued)

FOREIGN PATENT DOCUMENTS

CN          2800494 Y        7/2006
CN        201084738 Y        7/2008
(Continued)

*Primary Examiner* — Basil Katcheves
(74) *Attorney, Agent, or Firm* — Lucas & Mercanti, LLP

(57) ABSTRACT

Walkable photovoltaic floor, constituted of pieces of laminated glass composed of at least two layers of glass (1 and 2), joined together by an encapsulant (6), by an intermediate layer of photovoltaic material (3), and by a peripheral sealed frame (4).

11 Claims, 2 Drawing Sheets

(56) References Cited

U.S. PATENT DOCUMENTS

| | | | |
|---|---|---|---|
| 5,733,382 A * | 3/1998 | Hanoka | 136/251 |
| 5,762,720 A * | 6/1998 | Hanoka et al. | 136/251 |
| 6,114,046 A * | 9/2000 | Hanoka | 428/515 |
| 6,384,321 B1 * | 5/2002 | Mikoshiba et al. | 136/263 |
| 6,414,236 B1 * | 7/2002 | Kataoka et al. | 136/251 |
| 6,462,266 B1 * | 10/2002 | Kurth | 136/251 |
| 6,657,119 B2 * | 12/2003 | Lindquist et al. | 136/251 |
| 7,145,071 B2 * | 12/2006 | Spivack et al. | 136/263 |
| 7,759,158 B2 * | 7/2010 | Bachrach et al. | 438/80 |
| 7,901,991 B2 * | 3/2011 | Bonucci et al. | 438/115 |
| 2001/0015220 A1 * | 8/2001 | Benz et al. | 136/251 |
| 2005/0072458 A1 | 4/2005 | Goldstein | |
| 2011/0019351 A1 * | 1/2011 | Bayne et al. | 361/679.01 |
| 2011/0091707 A1 | 4/2011 | Jousset et al. | |

FOREIGN PATENT DOCUMENTS

| | | |
|---|---|---|
| CN | 201138666 Y | 10/2008 |
| CN | 201687353 U | 12/2010 |
| GB | 2455511 A | 6/2009 |
| JP | 2000-008591 A | 1/2000 |
| WO | WO 02101839 A1 | 12/2002 |
| WO | WO2008/004889 A1 | 1/2008 |
| WO | WO2012/038955 A1 | 3/2012 |

\* cited by examiner

WALKABLE PHOTOVOLTAIC FLOOR

CROSS REFERENCE TO RELATED APPLICATION

This Application is a 371 of PCT/ES2013/070266 filed on Apr. 25, 2013, which, in turn, claimed the priority of Spanish Patent Application No. P201230932 filed on Jun. 14, 2012, both applications are incorporated herein by reference.

FIELD OF THE INVENTION

The present invention is referred to a walkable photovoltaic floor based on photovoltaic laminated glass pieces, mounted on traditional pedestals, similar to a commercial technical floor.

The invention objective is to provide a walkable floor capable of producing electrical energy, based on glass elements that incorporate a photovoltaic active material.

BACKGROUND OF THE INVENTION

By WO2012038955 pavements are known as asphaltic coatings capable of producing electricity through the occlusion piezoelectric components, which are composed of a coating layer, generally asphalt, under which are disposed or occluded materials or piezoelectric components. The use of this type of floors is specific to pavements such as both roads and streets assets over road traffic and/or pedestrians, piezoelectric components generate an electrical current that is often applied in feed compounds based on LEDs, applications very limited.

A similar philosophy is known under the name of "Solar Highway". This is specifically designed for applications in which generating solar electricity with LED systems combine to create informative texts on the own pavement product.

In all the above cases, the pavement is made by a mass which continuously covers the surface and is especially applicable to the construction of streets and roads.

DESCRIPTION OF THE INVENTION

The present invention is related to a walkable floor, formed of separate pieces, which contains a photovoltaic component capable of producing electricity. The walkable floor is specially designed as walkable allowing pedestrians' transit, ensuring the capability of anti-slip and bearing capacity, maintaining the degree of transparency required for photovoltaic application, and not as asphalt paving for roads. The pieces from which the walkable floor is built-up consist in a laminated glass, joined together, between which a layer of photovoltaic material is added, that allows achieving the production of electricity and obtaining floors with a certain degree of transparency or with different colors.

The walkable floor of the invention allows incorporating LED lighting, thanks to the technical floor characteristics, and the possibility of integrating transparency in its component parts.

The floor of the invention is composed by laminated glass layers incorporating an active intermediate layer of solar photovoltaic material which allows producing electricity when the floor is irradiated by a lighting source. These elements are intended to be placed in a similar way to a technical floor, so that they will produce a space between them and the floor. This space will be determined by the height of the pedestals, which are used for holding the pieces of glass.

In order to protect the photovoltaic solar material, the glass units incorporate a perimeter seal. In addition, they integrate into its upper surface a treatment specifically designed to give non-slip properties and thus ensure transit safety and minimize the risk of slipping, as explained below.

The invention aims to contribute to the electricity generation of the building, being optimized for this use in these applications. The elements of the walkable floor of the invention will consist of at least two layers of laminated glass with same shape and joined together, for example by a polymeric material. The pieces also incorporate an intermediate layer of photovoltaic material and a peripheral sealed frame, as a protective medium of the photovoltaic elements.

The piece can be constituted by only two layers of laminated glass, being the photovoltaic interlayer composed by a circuit of crystalline silicon cells.

In this constitution the circuit of crystalline silicon solar cell is disposed between two polymeric layers, through which the circuit is joined to the laminated glass and those layers together.

The bottom layer of the laminated glass will have a hole for the output of the photovoltaic circuit poles.

According to a variant implementation, each piece is composed of three layers of overlapping laminated glass, of which the central layer is a bearer, on one of its surfaces at least, of a coating of a transparent conductive material, and an amorphous silicon film, which defines an n-i-p junction, where both the light absorption and charge separation occurs.

Whatever the composition of the laminated glass is, the polymeric material or encapsulant used between layers of glass could be colored, in order to achieve a certain tint or vivid color to the floor, then obtaining pieces with a certain degree of transparency.

Preferably the upper layer of each element will be extra-clear tempered glass, allowing maximum transparency or specific color allowed by the polymeric material used. Furthermore, the upper layer of glass on its upper surface will incorporate an anti-slip treatment.

The anti-slip treatment on the upper face could consist of metal oxide particles embedded in the surface, textured surface, or other technologies and/or processes applicable to this purpose. In order to minimize losses of photovoltaic production, this anti-slip treatment affects minimally the light transmittance.

The perimeter seal of the pieces will be comprised of a silicone layer applied on the edge. On this silicone layer could be fixed a frame of L-shaped profile, for example made of metal, which will attached through one of its branches over the silicon layer and with the other branch covers partially the bottom surface of the lower layer glass.

The sealing of the parts can be completed by a sealing cord, e.g. silicone, disposed between the edges of the frame and the piece of laminated glass.

Fixing the peripheral frame over the glass can be obtained by a double-sided adhesive tape when it is applied to the inner surface of the branch of the L-shaped profile which will rest on the bottom surface panel.

The characteristics described previously allow the elements of the walkable floor of the invention, incorporating lighting devices as for example LED strips attached to the peripheral frame.

BRIEF DESCRIPTION OF THE DRAWINGS

In the accompanying drawings shows, by way of non-limiting example, an embodiment of photovoltaic laminated glass pieces for the realization of photovoltaic walkable flooring formed according to the invention.

DETAILED DESCRIPTION OF AN EMBODIMENT

Figure 1:
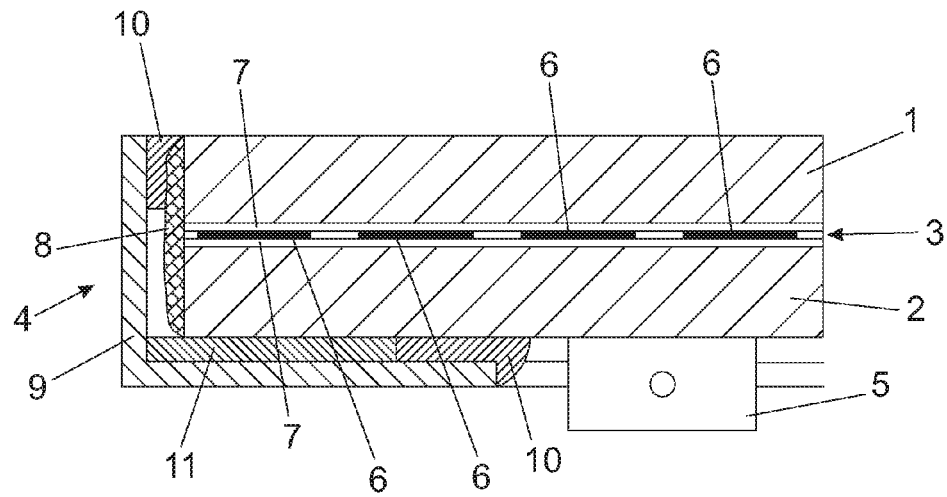
FIG. 1 is a partial section of a piece composed of two layers of glass and an intermediate layer of photovoltaic material.

In FIG. 1 is shown, in partial section, a piece of photovoltaic laminated glass for forming the walkable floor of the invention. This piece is composed by two layers 1 and 2 of laminated glass, an intermediate layer 3 of photovoltaic material, and a peripheral sealed frame 4.

Layers 1 and 2 can be formed by tempered glass, being the upper layer 1 of extra clear glass in order to encourage maximum light penetration. The lower layer 2 must have an opening through which the positive and negative terminals of the photovoltaic circuit 3 will be extracted for connection to a junction box 5.

The intermediate photovoltaic layer 4 is formed by a circuit of interconnected cells 6, which has been previously exposed to the necessary treatments for converting them in devices with photovoltaic properties. These cells will be crystalline or amorphous silicon. The electrical connection between cells will be in series, although it may also have series-parallel connections according to electrical requirements. The circuit formed by photovoltaic cells 6 is disposed between two polymer layers 7, for example EVA (Ethyl Vinyl Acetate) or PVB (Polyvinyl Butyral), and this assembly is prepared in turn between the layers 1 and 2 of the glass, serving the polymer layers 7 as a bonding medium of those layers of glass. The entire set passes to laminate in order to fit its different components together properly.

On the upper surface of glass layer 1 may be applied an anti-slip treatment, for example based on metal oxide particles. Other options are possible, such as chemical or physical treatment of the glass surface, to achieve texturing that allows an anti-slip effect.

As a medium of protection of the intermediate photovoltaic layer 3, the piece of glass is provided by peripheral sealed frame which may include a silicone layer 8 applied over the edge of that element. In addition this peripheral sealed frame can be completed by an L-shaped profile frame 9, between both the edges and the piece of glass strands 10 of a sealing material, such as silicone. Section attachment 9 to glass element can be achieved with double-sided adhesive tape 11.

Figure 2:
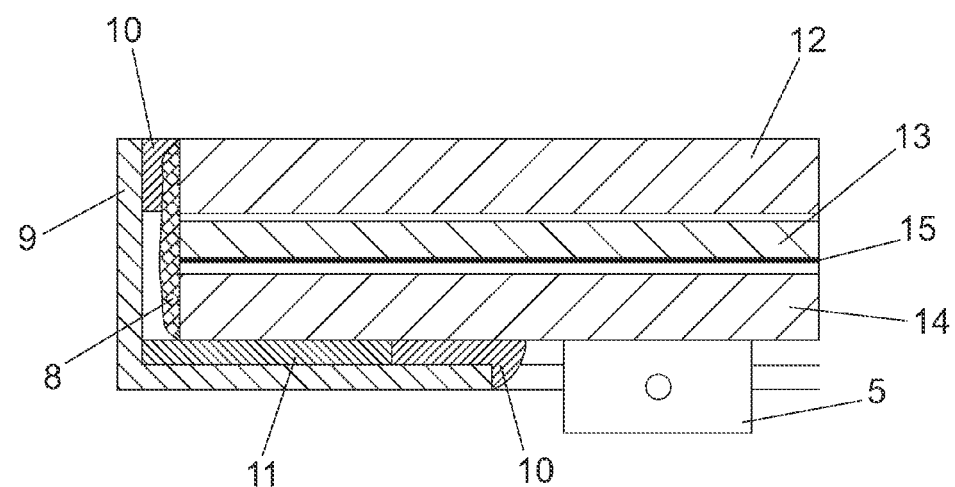
FIG. 2 is a similar section to FIG. 1, showing an execution variant.

In FIG. 2 an alternative embodiment according to which the piece is constituted by three glass layers 12, 13 and 14 is shown. On one surface of the intermediate glass layer 13, a layer of transparent conductive material 15 is deposited, preferably based on metal oxides. Subsequently, over this layer of conductive material, several layers of amorphous silicon are applied, obtaining an n-i-p junction, where the light absorption and the charge separation occur. A rear metal contact is added in this layer, forming all a photovoltaic active layer. Using a laser processing, cells and connections are configured between them. Laser also can eliminate lines photovoltaic material to enhance transparency. The degree of transparency depends on the amount of material removed.

With the previous description is already obtained a layer of glass 13 with the photovoltaic device in one of its faces. This part is then laminated with tempered glass 12 and 14.

As in the previous case, the top layer 12 will be extra glass to allow the maximum penetration of light. The glass layer 14 will have one or two small holes for the output contacts to the junction box 5.

Similarly on the edge of the photovoltaic laminated glass, a layer of silicone 8 is applied and over this one a frame 9, preferably made of metal and with L-shaped profile. Between the ends of the profile and the glass, strands 10 of sealing material of silicone too can be applied. Finally, as in the previous case, on the inner surface of the lower branch of the profile 9, double-sided adhesive tape for fixing the profile to the glass is applied.

The laminated glass photovoltaic piece of FIG. 2, as the example showed in FIG. 1, incorporated in the upper surface of layer 12 an anti-slip treatment. For the construction of the floor of the invention, the photovoltaic technology choice will be an optional feature, being the most common both the crystalline silicon cell (FIG. 1) and the thin film amorphous silicon (FIG. 2).

Furthermore, it will be an optional feature that the floor has some degree of transparency, thanks to the different ways there are to get this property in some of the photovoltaic technologies above mentioned.

For example, in case of crystalline silicon cells, FIG. 1, this transparency is given by the unoccupied space left between cells 6, while in case of amorphous silicon, FIG. 2, can be given by removing of lines of material by a process laser as noted above.

In addition, It will be optional that the adhesion between the glass that form the laminated glass, comes given by a polymeric material of some color in order the appearance of the ground could have different colors. Moreover, in case of transparencies, is optionally to apply a treatment on the lower glass so that the appearance in color is going to be different from the conventional.

In any of the embodiments described, the walkable photovoltaic floor could incorporate LED lighting, which shall be located in the space between the floor and the slab, for illuminating this space, being this one, the most common application when the slabs of glass have a degree of transparency.

Figure 3:
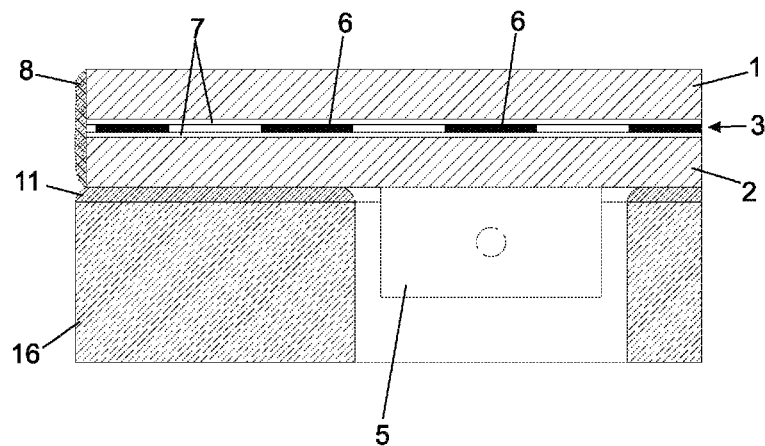
FIGS. 3 and 4 show an execution variant of the pieces showed in FIGS. 1 and 2.
Figure 4:
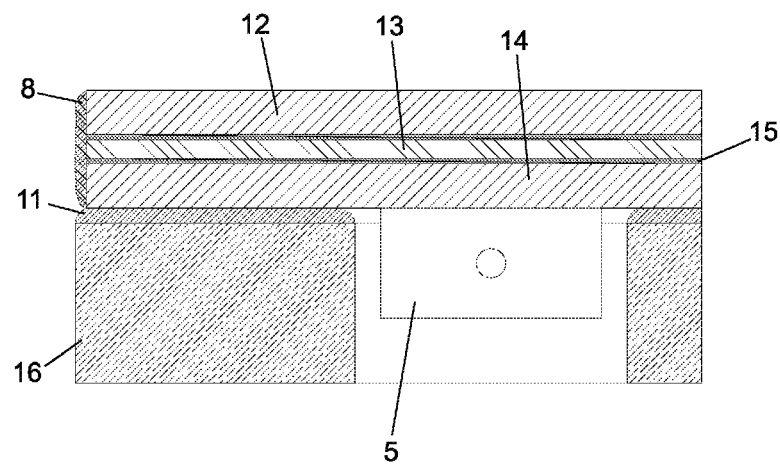

Both in the example of FIG. 1 as in the embodiment of FIG. 2, the glass layers 1, 2, 12, 13 and 14 can be of small thickness, in which case the pieces should be fitted in a reinforcing layer 16, as shown in FIGS. 3 and 4, in which the same references as in FIGS. 1 and 2 to designate equivalent components are used. The connection between the reinforcing layer 16 and the lower glass layer 2-14 can be achieved by any system. This reinforcing layer, for example, can be made of ceramic, natural stone, textile cement or reinforced cement, etc.

The invention claimed is:

1. Photovoltaic walkable floor, comprising
pieces of laminated glass composed of at least two layers of glass, the same shape and joined together by an encapsulant,
a plurality of pedestals holding the pieces of laminated glass,
an intermediate layer of photovoltaic material,
a perimeter seal comprising silicon layer applied on edges of the pieces of laminated glass,
a metal frame of L-shaped profile fixed on the silicon layer, wherein
the photovoltaic intermediate layer comprises a circuit having a configuration of cells and connections,
an upper layer of the at least two layers of glass comprises clear tempered glass, an upper surface of the upper layer comprises anti-slip treatment, the anti-slip treatment comprising metal oxide particles embedded in the surface wherein the treatment does not affect light transmittance through the layer, and a lower layer of the at least two layers of glass comprises at least one hole for the output contacts of the circuit to a junction box.

2. Floor according to claim 1, wherein the laminated glass pieces are composed of two layers of glass and the photovoltaic intermediate layer is composed by a circuit of crystalline silicon cells.

3. Floor according to claim 2, wherein the crystallyne solar cells are interconnected between each other forming strings encapsulated between polymeric foils, and then laminated between two glazing lites.

4. The floor according to claim 2, wherein the bottom layer of the glass has at least one hole for the exit of the poles of the photovoltaic circuit.

5. Floor according to claim 1, wherein the pieces of laminated glass are composed of three overlapped layers of laminated glass, of which the central layer is the bearer, at least on one of its surfaces, of one photovoltaic layer.

6. The floor according to claim 1, wherein the polymeric binder material is colored.

7. The floor according to claim 1, wherein the the L-shaped frame fixed on the silicone layer partially covers a lower surface of the lower layer of the glass.

8. Floor according to claim 7, wherein between the edges of the frame and the photovoltaic glass is arranged a sealing bead of silicone.

9. Floor according to claim 7, wherein the peripheral frame is fixed to the lower surface of the lower layer of the glass by a double-sided adhesive tape.

10. The floor according to claim 1, wherein the walkable floor of photovoltaic glass incorporates lighting technology formed by LED strips adhered to the peripheral frame.

11. The floor according to claim 1, wherein under the lower layer of glass, a layer of reinforcement material is included.

* * * * *